(12) United States Patent
Dubbaka et al.

(10) Patent No.: US 10,361,068 B2
(45) Date of Patent: *Jul. 23, 2019

(54) METHODS OF FORMING FEATURES

(71) Applicant: SEAGATE TECHNOLOGY LLC, Cupertino, CA (US)

(72) Inventors: Sridhar Dubbaka, Eden Prairie, MN (US); Sriram Viswanathan, Chanhassen, MN (US); Christina Hutchinson, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/707,346

(22) Filed: Sep. 18, 2017

(65) Prior Publication Data
US 2018/0114674 A1 Apr. 26, 2018

Related U.S. Application Data

(63) Continuation of application No. 14/938,026, filed on Nov. 11, 2015, now Pat. No. 9,767,989.

(60) Provisional application No. 62/078,123, filed on Nov. 11, 2014.

(51) Int. Cl.
*H01L 21/312* (2006.01)
*B44C 1/22* (2006.01)
*G11B 5/31* (2006.01)
*H01J 37/32* (2006.01)
*G11B 5/00* (2006.01)

(52) U.S. Cl.
CPC ...... *H01J 37/32009* (2013.01); *G11B 5/3116* (2013.01); *G11B 5/3163* (2013.01); *G11B 2005/0021* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| 6,521,542 B1 | 2/2003 | Armacost |
| 9,412,611 B2 | 8/2016 | Somervell |
| 2002/0039809 A1* | 4/2002 | Howard ............ H01L 21/02164 438/118 |
| 2003/0047764 A1 | 3/2003 | Joo |
| 2006/0009038 A1 | 1/2006 | Cohen |
| 2008/0261405 A1 | 10/2008 | Yang |

(Continued)

OTHER PUBLICATIONS

Ogawa, Tsuyoshi et al., "Planarizing Material for Reserve-Tone Step and Flash Imprint Lithography," *Journal of Micro/Nanolithography, MEMS, and MOEMS*, 13(3), 031302-1-031302-7 (Jul.-Sep. 2014).

(Continued)

*Primary Examiner* — Shamim Ahmed
(74) *Attorney, Agent, or Firm* — Mueting, Raasch & Gebhardt, P.A.

(57) ABSTRACT

A method of forming a feature in a void, the method including filling the void having at least one sloped wall with a polymeric material; forming a layer of photoresist over the polymeric material; forming a gap in the layer of photoresist; and etching the polymeric material exposed by the gap in the layer of photoresist to form a feature.

19 Claims, 5 Drawing Sheets

(56) References Cited

U.S. PATENT DOCUMENTS

2012/0018198 A1   1/2012   Furutani
2012/0083128 A1   4/2012   Hung
2012/0133084 A1   5/2012   Ortner
2012/0223048 A1   9/2012   Paranjpe
2014/0127901 A1   5/2014   Lu
2014/0273426 A1   9/2014   Li

OTHER PUBLICATIONS

Brewer Science® BSI.F12022 Data Sheet, 1page.
Brewer Science® Level® M10-44 Data Sheet, 2012, 1 page.
Brewer Science® Level® M10, Planarization Coating, 2012, 9 pages.
Futurrex Productivity Tools, Planarizing Coating PC3-1500, 1 page.

* cited by examiner

METHODS OF FORMING FEATURES

PRIORITY

This application claims priority to U.S. application Ser. No. 14/938,026 entitled METHODS OF FORMING FEATURES filed on Nov. 11, 2015, now U.S. Pat. No. 9,767,989, and which claims priority to U.S. Provisional Application No. 62/078,123 entitled METHOD OF FORMING WRITE POLE filed on Nov. 11, 2014, the disclosures of which are incorporated herein by reference thereto.

SUMMARY

Disclosed are methods of forming at least one feature in a void, the method including filling the void having at least one sloped wall with a polymeric material; forming a layer of photoresist over the polymeric material; forming a gap in the layer of photoresist; and etching the polymeric material exposed by the gap in the layer of photoresist to form the at least one feature.

Also disclosed are methods of depositing material in a void, the method including filling the void having at least one sloped wall with a polymeric material; at least partially curing the polymeric material; forming a layer of photoresist over the at least partially cured polymeric material; forming a gap in the layer of photoresist; etching the at least partially cured polymeric material exposed by the gap in the layer of photoresist to form at least one feature; and depositing material in the void.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Many methods and processes utilize various photolithograph methods and processes to form features for forming portions of devices. Different scenarios render such typical methods less effective. For example, a write pole for a heat assisted magnetic recording (HAMR) head requires performing critical dimension (CD) lithography on a sloped wall of a larger trench or void that is almost 1 micrometer (μm) deep. Furthermore, the slope of the void itself has significant topography and there is topography on the bottom surface of the void. Such circumstances can make it difficult to form the requisite features. Existing photolithography methods and processes are resolution limited because of the limitation of depth of focus (DOF). This is a fundamental limitation because a high DOF requires a lower numerical aperture (NA) and a lower NA automatically gives a larger CD (see equations 1 and 2 below).

$$CD = k_1 \cdot \frac{\lambda}{NA} \quad \text{(Eqn. 1)}$$

$$DOF = k_2 \cdot \frac{\lambda}{NA^2} \quad \text{(Eqn. 2)}$$

Therefore, in order to obtain a lower resolution process, a process with a lower DOF is necessary.

Disclosed methods enable forming very small features within a larger void and even larger voids that include topography. The topography can be present on the walls, e.g., they can be sloped walls with or without additional topography, the base, or any combination thereof, and disclosed processes can still form features having very small dimensions within the larger void.

The larger void, in which a feature is going to be formed, can have various dimensions. In some embodiments, the void can have an average depth of at least 0.5 μm deep, at least 0.75 μm deep, or at least 1 μm deep. The void can have any shape. For example, the void can be square, rectangular, triangular, trapezoidal, circular, elliptical, irregular, or any combination thereof. The void can have various dimensions depending on the shape or general shape thereof. An illustration of a specific, non-limiting void which can have a feature formed therein using disclosed methods, includes a trapezoidal shaped void having a depth of 950 nm, sidewalls of 10 μm and 36 μm, and a width across of 14 μm. Another illustration of a specific, non-limited void which can have a feature formed therein using disclosed methods, includes a generally triangular shaped void having a depth of 800 nm, sidewalls of 10 μm and 36 μm, and a width across of 14 μm with a 30 degree slope on at least one wall and with topography on the bottom surface of the void.

Figure 1A:
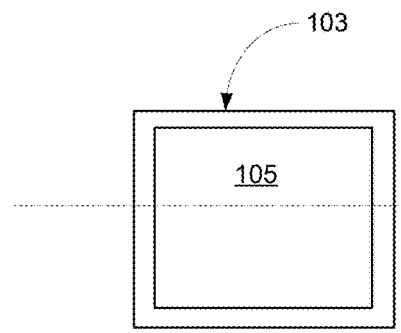
FIGS. 1A to 1H are top down (FIG. 1A) and cross section (FIGS. 1B to 1H) views of structures at various stages of formation using a specific illustrative disclosed method.
Figure 1B:
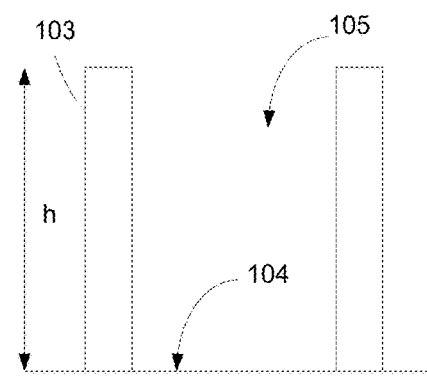

FIG. 1A shows a top down view of a void 105. The void 105 includes side walls 103. FIG. 1B shows a view of the cross section taken through FIG. 1A, as indicated by the dashed line in FIG. 1A. The void 105 in FIG. 1B is formed from the sidewalls 103 and has a height, h. The height, h, of the void can be the average height from the base of the void to the top. In some embodiments, the height, h, can be at least 0.5 μm, at least 0.75 μm, or at least 1μm. Although not depicted in FIG. 1B, the base 104 can have features thereon and need not be flat. FIG. 4 shows a view of a cross section of a void 405 that includes two sloped side walls 403.

Disclosed methods utilize a polymeric material to fill the void and then use photolithographic methods to form the feature within the now filled in void. In some embodiments, disclosed methods can include at least the steps of depositing polymeric material in a void, forming a layer of photoresist over the polymeric material, forming a gap in the photoresist material, and etching the polymeric material exposed by the gap in the photoresist.

Illustrative polymeric materials that can be utilized herein can generally include any material that can fill the void and be selectively removed by some process. In some embodiments, the polymeric material can be a planarizing material, for example a self-leveling planarizing material. Illustrative, non-limiting examples of polymeric materials that can be utilized herein can include, for example LEVEL® M10 planarizing material and BSI F12022 planarizing material (both from Brewer Science, Inc. (Rolla, Mo.)), PC3-1500 planarizing coating (from Futurexx, Inc. (Franklin, N.J.)), SIUL® 62 (from Shin-Etsu Chemical (Chiyoda, Tokyo)) and epoxy functionalized Si-12 (epoxy-Si-12) (Ogawa, et al. J. Micro/Nanolith. MEMS MOEMS 13 (3), 031302 (July-September 2014), the disclosure of which is incorporated herein by reference thereto).

The polymeric material can be deposited in the void using any known methods. Illustrative methods for depositing the polymeric material in the void can include, for example spin coating and spray coating. In some embodiments, the polymeric material can be deposited in the void using spin coating. A polymeric material can be chosen based on its ability to effectively fill the void, fill the void and create a substantially planar surface, or both. In some embodiments, these properties can be compared by determining a planarization percentage. To measure the planarization percentage, the depth across a sloped wall can be measured (D) using, for example profilometry. Next, the polymeric material can be coated, for example, spin coated over the sloped wall and the depth measured again (Dp). The planarization percentage can then be [(D−Dp)/D]*100. This test was carried out on LEVEL® M10 planarizing material, BSI F12022 planarizing material and SIUL® 62. LEVEL® M10 planarizing material produced a planarization percentage of about 97%, BSI F12022 planarizing material produced a planarization percentage of about 58% and SIUL® 62 produced a planarization percentage of about 48%.

Generally, an amount of polymeric material that can entirely fill the void and still has an excess of material is utilized. In some embodiments, enough polymeric material to fill the void completely and still have an overburden (thickness of the polymeric material above the top of the void) of at least 20% of the thickness of the void can be utilized. In some embodiments, the overburden can be at least 50%, in some embodiments at least 100% (the thickness above the void is just as thick as the deepest point of the void), and in some embodiments at least 120%. A specific example can include enough polymeric material to fill a void whose deepest point is 1 μm and have an overburden thickness of 1 μm. In another specific embodiment, the average thickness of the polymeric material can be at least 1 μm thick (a polymeric material with such a thickness could be useful in a void with an average depth of about 850 nm).

The polymeric material may optionally be cured. The method of curing the polymeric material will of course depend at least in part on the particular polymeric material. In some embodiments, the polymeric material can be cured using radiation (e.g., e-beam radiation, UV radiation, etc.), using heat, or combinations thereof for example. In some embodiments, the polymeric material can be cured using UV radiation. In some embodiments, the polymeric material can be cured using heat. In some embodiments, the polymeric material can be cured using heat and UV radiation. In some embodiments, the polymeric material can be heated (e.g., to at least 90° C., or about 100° C.), UV treated, and then heated again (e.g., to at least 90° C. or about 100° C.).

Figure 1C:
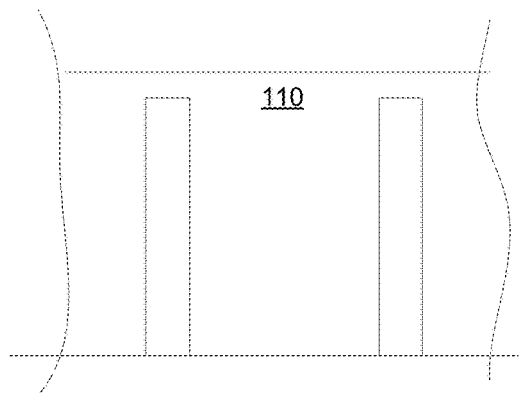

FIG. 1C shows the structure after the polymeric material 110 has been deposited in the void. As seen in that figure, the polymeric material 110 overfills the void to some extent.

In some embodiments, a hard mask can be formed over the polymeric material. Use of a hard mask over the polymeric material can be useful because it may better allow for etching deep, higher aspect ratio features that convention photoresists typically cannot withstand. In some embodiments, the polymeric material being utilized may have an etch rate that is almost the same as photoresist. Without the addition of the hard mask layer, the etching step may not be as effective, or as selective as desired. Furthermore, critical dimension patterning typically requires or is more effective with thin photoresist. In such circumstances, it can be advantageous to first transfer the pattern from photoresist, then into a hard mask layer and finally down through the polymeric material. The hard mask layer can be applied over the polymeric material using known methods, for example, spin coating or spray coating. In some embodiments, the hard mask layer can be deposited using spin coating. The hard mask, once applied may also benefit from further processing steps. The specific additional processing steps that may be utilized can depend at least in part on the particular hard mask being utilized. In some embodiments, for example heat treatment (e.g., heating or baking the structure from 100° C. to 200° C. for example) can be utilized on the applied hard mask.

The optional hard mask layer can include a silicon based hard mask, or a carbon based coating. A specific, illustrative material that can be used as the hard mask layer is SiHM-A943 from Shin-Etsu Chemical (Chiyoda, Tokyo). If utilized, the SiHM-A943 can be spin coated on (for example) and optionally baked from 110° C. to 150° C. for example.

Whether the optional hard mask layer is utilized or not, a next step includes deposition of a photoresist layer (either on the hard mask layer or the polymeric material). The photoresist may be a negative or positive photoresist. The photoresist may be applied using known methods, for example spin coating. The photoresist, once applied may also benefit from further processing steps. The specific additional processing steps that may be utilized can depend at least in part on the particular photoresist being utilized. In some embodiments, for example heat treatment (e.g., heating or baking the structure to at least 100° C., or more specifically at least 110° C.) can be utilized on the applied photoresist. Heat treating the polymeric material can function to reflow the polymeric material, thereby further improving the surface planarity.

The photoresist utilized herein can include any photoresist material. Specific, non-limiting examples of photoresist that can be utilized can include, for example I-line photoresist, KrF photoresist or ArF photoresist.

Once the photoresist layer has been formed and any optional treatments have been carried out on it, the next step is to selectively expose the photoresist and develop it. As will be known, the effect of exposing and developing the photoresist is dependent on whether or not it is a negative or positive photoresist. A positive photoresist is a type of photoresist where the portion of the photoresist exposed to light becomes soluble to the developer. A negative photoresist is a type of photoresist where the portion of the photoresist exposed to light becomes insoluble to the developer. The portions of the photoresist exposed will obviously depend on the particular feature being formed.

Figure 1D:
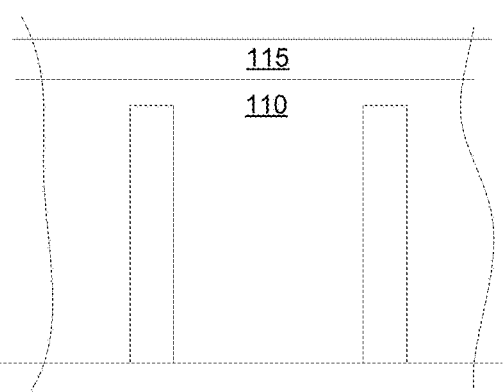

FIG. 1D shows the structure after formation of the photoresist layer 115. The photoresist layer 115 can generally be deposited at least over the area of the polymeric material 110 that fills the void. Although not depicted in this figure, if the optional hard mask layer were utilized, it would be a layer between the top surface of 110 and the bottom surface of the photoresist layer 115.

Known methods of patterning, exposing and developing the photoresist can be utilized herein and the particular methods and processes utilized can obviously depend at least in part on the particular photoresist being utilized. In some embodiments, a positive photoresist can be utilized. In some particular embodiments, an I-line photoresist can be utilized. In a specific illustrative embodiment, this particular photoresist can be baked to about 110° C. after being deposited, then selectively exposed at 193 nm, baked again to 105° C. and then developed using tetramethylammonium hydroxide (TMAH).

Figure 1E:
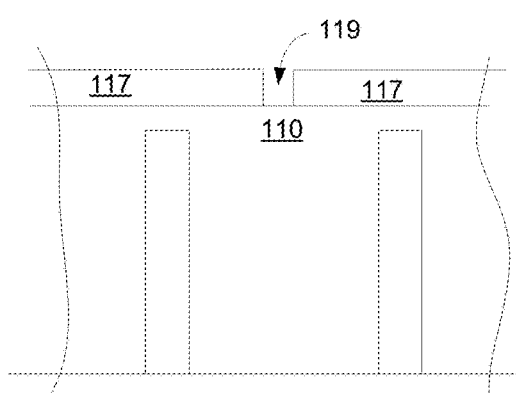

FIG. 1E shows the structure after selectively exposing and developing the photoresist layer. At this point, a gap 119 is formed in the patterned photoresist layer 117. There can of course be one or more than one gap formed in the photoresist layer, even though only one is depicted in FIG. 1E.

If the optional hard mask was applied over the polymer material, the portions of the hard mask exposed by the developed photoresist (e.g., the portions of the hard mask exposed by the gaps in the photoresist) can then be etched away. The particular etching method can depend at least in part on the particular hard mask utilized. Possible etching methods that can be utilized can include, for example chemical etching or plasma etching. In some illustrative embodiments, plasma etching, for example fluorine or oxygen plasma etching can be utilized. The species utilized in the plasma etching will depend, at least in part on the particular hard mask utilized.

Once the gaps have been formed all the way to the polymer material (either simply by developing the photoresist or by both developing the photoresist and etching the hard mask) the next step includes removing the polymeric material exposed by the gaps in the photoresist. This can be accomplished in numerous ways, depending of course on the particular polymeric material being utilized. In some embodiments, the polymeric material can be removed by etching. The particular etching method can depend at least in part on the particular polymeric material utilized. Possible etching methods that can be utilized can include, for example chemical etching or plasma etching. In some illustrative embodiments, plasma etching, for example fluorine or oxygen plasma etching can be utilized. The species utilized in the plasma etching will depend, at least in part on the particular polymeric material utilized.

Figure 1F:
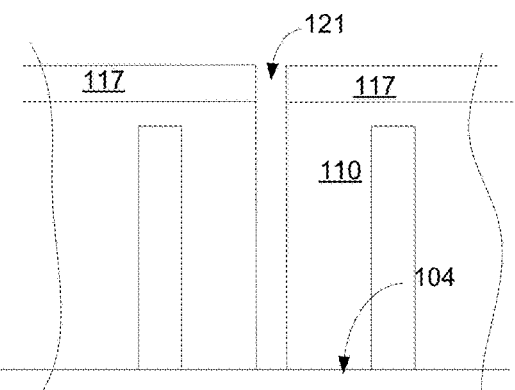

FIG. 1F shows the structure after the polymeric material exposed by the gap has been removed. This forms a trench 121 that may extend substantially all the way to the base 104 of the void.

A next optional step in disclosed methods includes deposition of a material in the trench formed in the polymeric material. The particular material to be deposited and the method of deposition can depend at least in part on the structure or device being formed using the disclosed method. Illustrative processes can include for example, deposition methods such as chemical vapor deposition (CVD), physical vapor deposition (PVD), atomic layer deposition (ALD), plating (e.g., electroplating), sputtering methods, cathodic arc deposition methods, and evaporative methods. In some embodiments, the material can be deposited by plating. Plating may be advantageous in comparison to some of the other methods because of the high aspect ratio of the trench where deposition is being undertaken. In some embodiments, the material can be deposited by electroplating the material.

It should also be noted that features formed via disclosed methods can have material deposited around them in the void. Once the material has been deposited around them in the void (for example, via electroplating) the polymeric material/optional hard mask/photoresist can then be removed, leaving gaps in the deposited material where the polymeric material/optional hard mask/photoresist was located.

In some specific illustrative embodiments, disclosed methods can be utilized to form a write pole for a magnetic recording head. In such methods, a magnetic material could be deposited in the trench. In some embodiments, various methods can be utilized to deposit the magnetic material. For example, electroplating can be utilized to deposit the magnetic material. In some specific illustrative embodiments, the write pole material can include at least one of CoFe, CoFeNi, CoFeRh, CoFeRu, CoFePt, CoFePd and NiFe, for example.

Figures 1G, 1H:
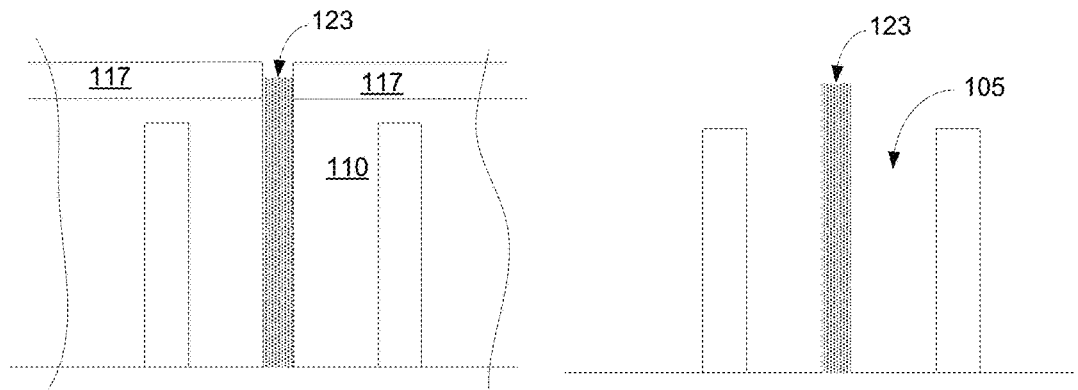

FIG. 1G shows the structure once material has been deposited in the trench. The material 123 need not, but can entirely fill the trench. In some embodiments, the material 123 can be deposited to a level that is at least higher than the polymeric material, for example.

Once the material has been deposited in the trench, a next step can include removing the polymeric material (110 in FIG. 1G) and the patterned photoresist material (117 in FIG. 1G). This can be accomplished in various ways and the specific methods and/or processes utilized can depend at least in part on the particular photoresist material and polymeric material utilized. In some embodiments, this can be accomplished by ashing. Because both the polymeric material and the photoresist material are organic, ashing, either with or without oxygen ($O_2$) can function to remove them. Because the deposited material 123 is most typically not organic, ashing will not affect it in any substantial or detrimental way. Alternatively, the photoresist material and the polymeric material may be removed by etching (e.g., wet etching (with $CF_4$ for example) or dry etching (with $O_2$ for example)), dissolving them in a suitable solvent, or combinations thereof.

FIG. 1H shows the structure after the polymeric material 110 and the patterned photoresist 117 have been removed. At this point, the only thing that remains is the deposited material or feature 123 within the void 105. Although not depicted in FIG. 1H, it will be understood that the feature can be formed anywhere within the void even in contact with a side wall of the void or any other pre-existing feature within the void. In some embodiments, the feature can be formed in contact with at least one side wall of the void, for example a sloped side wall of the void.

Figure 2A:
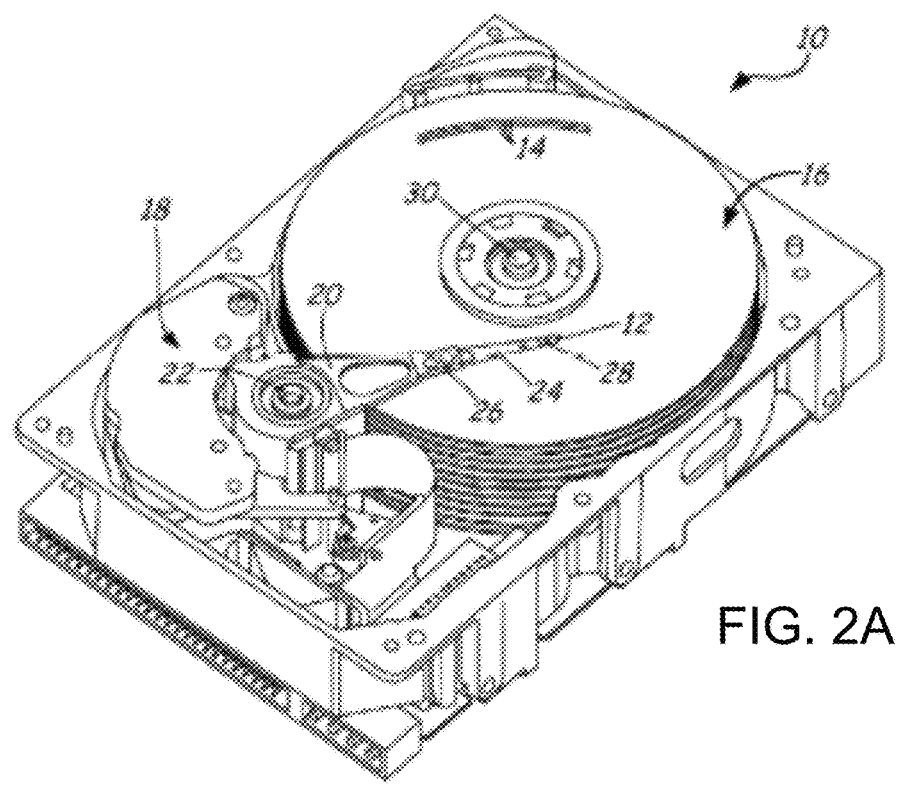
FIG. 2A is a perspective view of a magnetic disc drive and FIG. 2B is a cross sectional view of a perpendicular HAMR magnetic recording head and an associated recording medium.

In some embodiments, disclosed methods can be utilized to form a write pole for heat assisted magnetic recording (HAMR). HAMR utilizes radiation, for example from a laser, to heat media to a temperature above its curie temperature, enabling magnetic recording. Such a write pole can be part of a bigger structure of device. FIG. 2A is a perspective view of disc drive 10 including an actuation system for positioning slider 12 over track 14 of magnetic medium 16, in which a write pole made using a disclosed method could be utilized. For the sake of context, additional structures and portions of such a device will be described herein with respect to FIG. 2A. The particular configuration of disc drive 10 is shown for ease of description and is not intended to limit the scope of the present disclosure in any way. Disc drive 10 includes voice coil motor 18 arranged to rotate actuator arm 20 on a spindle around axis 22. Load beam 24 is connected to actuator arm 20 at head mounting block 26. Suspension 28 is connected to an end of load beam 24 and slider 12 is attached to suspension 28. Magnetic medium 16 rotates around an axis 30, so that the windage is encountered by slider 12 to keep it aloft a small distance above the surface of magnetic medium 16. Each track 14 of magnetic medium 16 is formatted with an array of data storage cells for storing data. Slider 12 carries a magnetic device or transducer (not shown in FIG. 2A) for reading and/or writing data on tracks 14 of magnetic medium 16. The magnetic transducer utilizes additional electromagnetic energy to heat the surface of medium 16 to facilitate recording by a process termed heat assisted magnetic recording (HAMR).

Figure 2B:
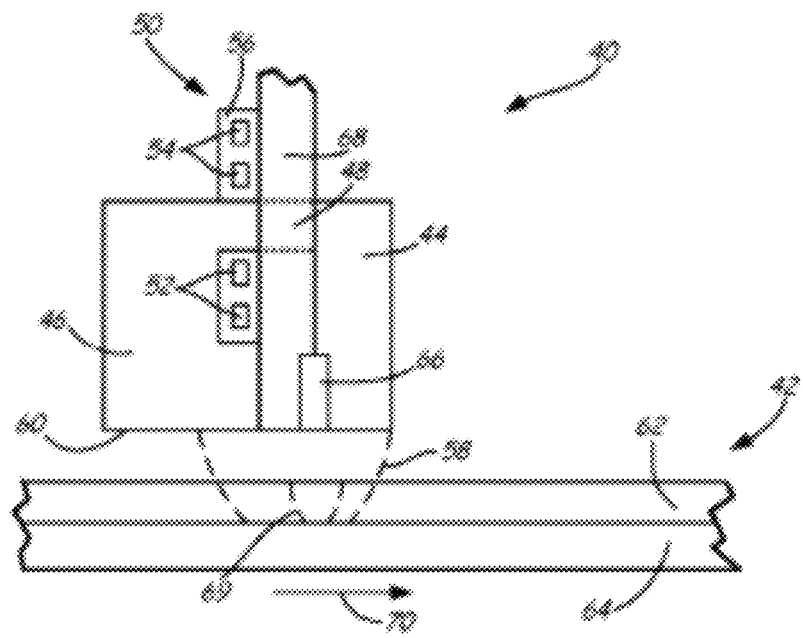

A HAMR transducer includes a magnetic writer for generating a magnetic field to write to a magnetic medium (e.g. magnetic medium 16) and an optical device to heat a portion of the magnetic medium proximate to the write field. FIG. 2B is a cross sectional view of a portion of a magnetic device, for example a HAMR magnetic device 40 and a portion of associated magnetic storage medium 42. HAMR magnetic device 40 includes write pole 44 and return pole 46 coupled by pedestal 48. Coil 50 comprising conductors 52 and 54 encircles the pedestal and is supported by an insulator 56. As shown, magnetic storage medium 42 is a perpendicular magnetic medium comprising magnetically hard storage layer 62 and soft magnetic underlayer 64 but can be other forms of media, such as patterned media. A current in the coil induces a magnetic field in the pedestal and the poles. Magnetic flux 58 exits the recording head at air bearing surface (ABS) 60 and is used to change the magnetization of portions of magnetically hard layer 62 of storage medium 42 enclosed within region 58. Near field transducer 66 is positioned adjacent the write pole 44 proximate air bearing surface 60. Near field transducer 66 is coupled to waveguide 68 that receives an electromagnetic wave from an energy source such as a laser. An electric field at the end of near field transducer 66 is used to heat a portion 69 of magnetically hard layer 62 to lower the coercivity so that the magnetic field from the write pole can affect the magnetization of the storage medium.

The write pole 44 in a HAMR head can be formed by using disclosed methods to form a trench and then depositing write pole material in that trench. Typically, write pole material is a high moment magnetic material. In some embodiments, write pole material has a magnetic moment of at least 2.0 tesla (T), or at least 2.4 T. In some specific illustrative embodiments, the write pole material can include at least one of CoFe, CoFeNi, CoFeRh, CoFeRu, CoFePt, CoFePd and NiFe.

The present disclosure is illustrated by the following examples. It is to be understood that the particular examples, assumptions, modeling, and procedures are to be interpreted broadly in accordance with the scope and spirit of the disclosure as set forth herein.

EXAMPLE

Figure 3A:
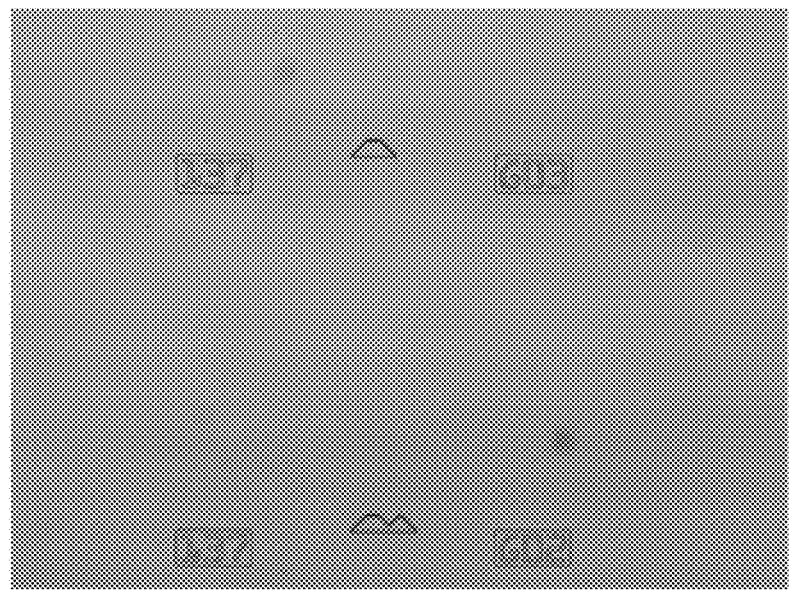
FIGS. 3A to 3D are scanning electron microscope (SEM) images of an illustrative void before (FIG. 3A) and after (FIGS. 3B to 3D) features were formed therein using a specific illustrative disclosed method.

FIG. 3A is a top down view from an optical microscope of a specific illustrative void. This illustrative void is made of nickel iron (NiFe) and is trapezoidal in shape, with the top side (as it is seen in FIG. 3A) having a dimension of 10 μm, the bottom side having a dimension of 36 μm and a height of 14 μm. The wall having the dimension of 10 μm had a slope of about 30° (visible in FIGS. 3C and 3D). The average depth of the void was about 800 nm.

The void was filled with LEVEL® M10-44 planarizing material using spin-coating at 1800 rpm to an average thickness of 2 μm. The structure was then baked on a hot plate at a temperature of about 100° C. for about 60 seconds. The structure was then I-line exposed (365 nm) at a 600 mJ dose to cure the planarizing material. Then the structure was again baked on a hot plate at a temperature of about 100° C. for about 60 seconds.

Next, a 110 nm thick layer of SiHM A943 was spin coated on the surface according to manufacturer's recommendations. The structure was then baked on a hot plate at about 180° C. for about 230 seconds. Then, a 330 nm thick layer of TOK-5071 photoresist (TOK, Hillsboro, Oreg.) was spin coated according to manufacturer's recommendations. The structure was then baked on a hot plate at about 110° C. for about 220 seconds. The structure was then selectively exposed to 193 nm wavelength exposure at 30 mJ dose and baked on a hot plate at 105° C. for about 220 seconds to form soluble portions of the photoresist. The photoresist was developed using tetramethylammonium hydroxide (TMAH) according to manufacturer's recommendations. The silicon hard mask layer was then plasma etched with fluorine chemistry plasma etch to remove it where it is exposed. The planarizing material was plasma etched with oxygen chemistry plasma etching remove it where it is exposed.

Figure 3B:
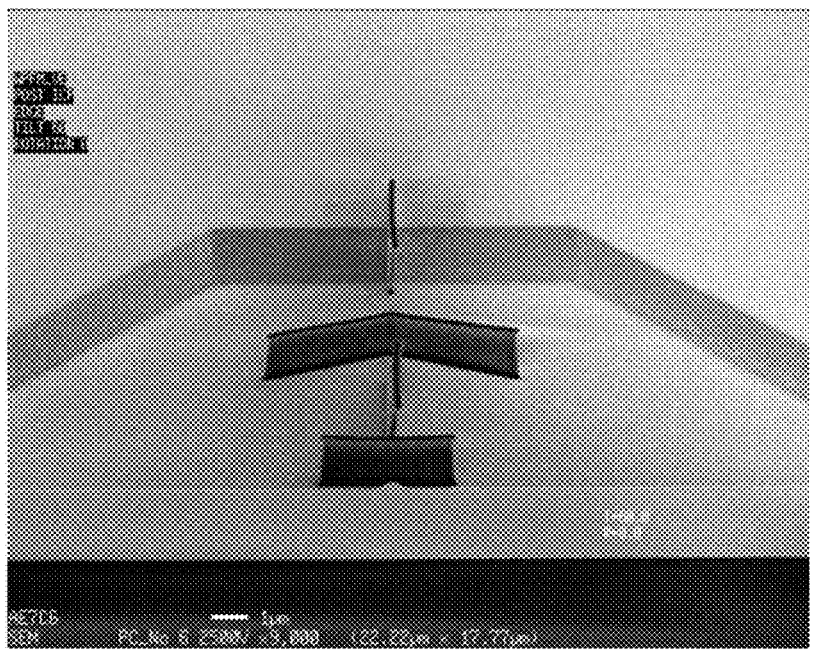
Figure 3C:
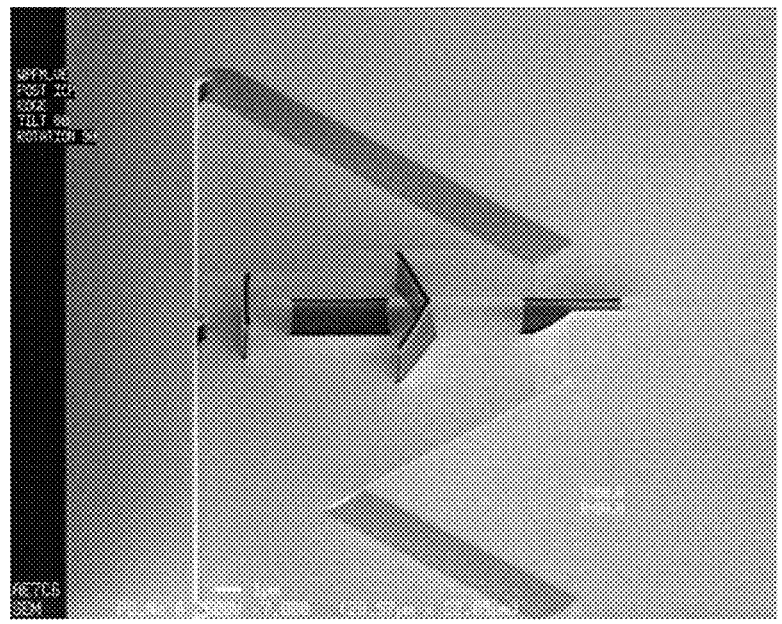
Figure 3D:
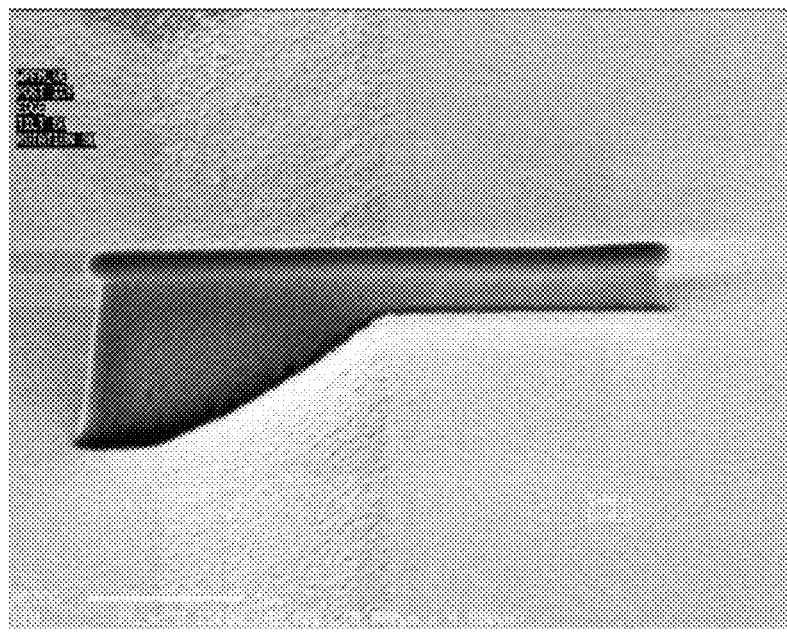

FIGS. 3B, 3C and 3D show features of the remaining polymeric material and overlying hard mask layer formed within the void using an example of a specific illustrative method disclosed herein. The features shown in FIGS. 3B, 3C and 3D (or similar features) could be utilized in various different ways to (for example) form a write pole. In some embodiments, a write pole material (e.g., CoFe) could be deposited and the write pole photo pattern could be transferred down into the pole material (via disclosed methods and features such as those depicted in FIGS. 3B, 3C and 3D) by either plasma etching or ion beam milling of the CoFe. For example, the features seen in FIGS. 3B, 3C and 3D could be used to etch down into the CoFe. Alternatively, a CoFe/NiFe seed layer could be deposited, methods disclosed herein could be used to form trenches and CoFe write pole material could be plated inside the trenches.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, "top" and "bottom" (or other terms like "upper" and "lower") are utilized strictly for relative descriptions and do not imply any overall orientation of the article in which the described element is located.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. For example, a conductive trace that "comprises" silver may be a conductive trace that "consists of" silver or that "consists essentially of" silver.

As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Use of "first," "second," etc. in the description above and the claims that follow is not intended to necessarily indicate that the enumerated number of objects are present. For example, a "second" substrate is merely intended to differentiate from another infusion device (such as a "first" substrate). Use of "first," "second," etc. in the description above and the claims that follow is also not necessarily intended to indicate that one comes earlier in time than the other.

Thus, embodiments of methods of forming features are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A method of forming at least one feature in a void, the method comprising:
    filling the void having at least one sloped wall with a polymeric material;
    forming a layer of photoresist over the polymeric material;
    forming a gap in the layer of photoresist; and
    etching the polymeric material exposed by the gap in the layer of photoresist to form the at least one feature, wherein at least one of the at least one features is formed in contact with the at least one sloped walls of the void.

2. The method according to claim 1 further comprising depositing a material in the feature, around the feature or both in and around the feature.

3. The method according to claim 2, wherein the at least one feature is a trench and the material is deposited only in the trench.

4. The method according to claim 2, wherein the at least one feature is a structure and the material is deposited around the at least one feature in the void.

5. The method according to claim 2 further comprising removing the polymeric material and the photoresist material after depositing material.

6. The method according to claim 2, wherein the material deposited is deposited at least partially on the sloped wall of the void.

7. The method according to claim 2, wherein depositing the material comprises plating the material.

8. The method according to claim 1 further comprising applying a hard mask layer on the polymeric material before the layer of photoresist is formed thereon.

9. The method according to claim 8, wherein the hard mask layer comprises silicon.

10. The method according to claim 1, wherein the step of filling the void with a polymeric material is accomplished by spin-coating the polymeric material.

11. The method according to claim 1 further comprising at least partially curing the polymeric material.

12. The method according to claim 1, wherein the polymeric material is a self-leveling material.

13. The method according to claim 1, wherein the polymeric material has a thickness that is at least 50% more than the deepest dimension of the void.

14. The method according to claim 1, wherein the polymeric material has a thickness of at least 1 micrometer ($\mu$m) in the void.

15. A method of depositing material in a void, the method comprising:
    filling the void having at least one sloped wall with a polymeric material;
    at least partially curing the polymeric material;
    forming a layer of photoresist over the at least partially cured polymeric material;
    forming a gap in the layer of photoresist;
    etching the at least partially cured polymeric material exposed by the gap in the layer of photoresist to form at least one feature within the void, wherein at least one of the at least one features is formed in contact with at least one of the sloped walls of the void; and
    depositing material in the feature, around the feature or both in and around the feature.

16. The method according to claim 15, wherein the at least one feature is a trench and the material is deposited only in the trench or the at least one feature is a structure and the material is deposited around the at least one feature in the void.

17. The method according to claim 15, wherein the polymeric material was spin-coated in the void.

18. The method according to claim 15 further comprising removing the cured polymeric material and the photoresist material after the material has been deposited in the void using ashing.

19. The method according to claim 15 further comprising forming more than one gap in the layer of photoresist.

* * * * *